United States Patent
Chrappan et al.

[11] Patent Number: 6,150,853
[45] Date of Patent: Nov. 21, 2000

[54] INTEGRATED UNIT GAIN OUTPUT STAGE

[75] Inventors: Francesco Chrappan, Bresso; Maurizio Nessi, Como; Alberto Salina, Limbiate, all of Italy

[73] Assignee: SGS-Thomson Microelectronics S.r.l., Agrate Brianza, Italy

[21] Appl. No.: 08/394,688

[22] Filed: Feb. 27, 1995

[30] Foreign Application Priority Data

Feb. 28, 1994 [EP] European Pat. Off. .............. 94830090

[51] Int. Cl.$^7$ ...................................................... H03K 3/00
[52] U.S. Cl. ...................... 327/108; 327/112; 327/309; 330/262
[58] Field of Search .................................. 327/108, 109, 327/110, 111, 112, 309, 587; 330/262, 263, 264, 267, 268, 269, 273, 274

[56] References Cited

U.S. PATENT DOCUMENTS

| | | | |
|---|---|---|---|
| 4,096,398 | 6/1978 | Khaitan | 300/269 |
| 4,329,600 | 5/1982 | Stewart | 327/108 |
| 4,336,503 | 6/1982 | Whatley | 330/264 |
| 4,587,491 | 5/1986 | Koterasawa | 330/268 |
| 4,857,863 | 8/1989 | Ganger et al. | 327/108 |
| 5,210,506 | 5/1993 | Koch et al. | 330/264 |
| 5,293,082 | 3/1994 | Bathaee | 327/108 |
| 5,319,258 | 6/1994 | Ruetz | 327/108 |
| 5,352,939 | 10/1994 | Hirabayashi et al. | 327/108 |
| 5,361,003 | 11/1994 | Roberts | 327/108 |
| 5,376,846 | 12/1994 | Houston | 327/108 |

FOREIGN PATENT DOCUMENTS

| | | |
|---|---|---|
| 309063 | 3/1989 | European Pat. Off. . |
| 8800987 | 11/1989 | Netherlands . |

OTHER PUBLICATIONS

IEEE Transactions On Consumer Electronics, vol. 38, No. 3, pp. 217–222. Aug., 1992.

*Primary Examiner*—Kenneth B. Wells
*Attorney, Agent, or Firm*—Theodore E. Galanthay; Allen, Dyer, Doppelt, Milbrath & Gilchrist, P.A.

[57] ABSTRACT

The operation of externally connected output power transistors of a class AB amplifier is controlled without employing any external sensing resistance of the output current by driving an externally connected power transistor through a level shifting buffer and employing a limiting network composed of an integrated transistor driven by the output of a signal amplifying stage and a resistance connected in series with its drain. The buffer stage shifts the level of the driving signal of the external power transistor by a value equal to the threshold voltage of the integrated transistor of the limiting network thus ensuring the turn-off of the external power transistor under quiescent conditions.

22 Claims, 4 Drawing Sheets

INTEGRATED UNIT GAIN OUTPUT STAGE

CROSS REFERENCE TO RELATED APPLICATION

This application claims priority from EP 94830090.0. However, the content of the present application is not necessarily identical to that of the priority application.

BACKGROUND AND SUMMARY OF THE INVENTION

The present invention relates to a unit gain output stage employing a pair of field effect transistors (FET), as output power devices, driven in class AB mode, particularly suited for monolithically integrated power amplifiers.

The designations of Class A, Class B, Class AB, and Class C amplifiers refer to ways of amplifying a bipolar signal, and specifically how an amplifier handles zero-crossings. One extreme case is Class A, where the driver devices of the output stage pass a DC current component which is so large that no zero-crossings occur at all. Another extreme case is Class C, where the output is "center-clipped," i.e. the output signal cuts off when the magnitude of input signal is within a certain band around zero. Both of these have great disadvantages: Class A is extremely wasteful of power, and Class C introduces a very large amount of distortion. Class B is an idealized intermediate case, where the output signal passes through zero at the same time as the input signal (unlike Class A), but no center clipping occurs (unlike Class C). (That is, in Class B one output driver drives the output positive when the input is positive, and the other output driver drives the output negative when the input is negative.) However, in practice it is very difficult to operate precisely in Class B, since the turn-off and turn-on of the two output drivers must be precisely matched to avoid crossover distortion (around the zero-crossing); so for audio and precision applications a Class AB mode is often used. This mode is basically a modification of Class B in which both output drivers are passing a small amount of current at the moment when the input signal crosses through zero. This avoids distortion without greatly increasing power consumption.

A technical problem of class AB power amplifiers employing FETs, for example a pair of n-channel MOS transistors, relates essentially to the ability of effectively controlling the quiescent current flowing through the pair of output power transistors and of reducing the so-called crossover distortion.

The necessity of controlling the quiescent current derives from the inevitable compromise between the desirability of reducing power dissipation, which requires a low quiescent current Iq, and of minimizing crossover distortion caused by the non-linearity of the operating characteristics of the output devices, which non-linearity may become intolerably pronounced at relatively low bias current levels.

Thus for maximum linearity, it is desirable to keep the minimum gate voltage close to the threshold voltage. However, if the minimum gate voltage is above the threshold voltage, a significant quiescent current will flow, since neither power transistor will ever turn off completely. This causes excess power consumption, and excess heat dissipation in the power devices, both of which are undesirable.

Another well known cause of crossover distortion resides in the fact that, in a simple switching circuit, one or the other of the two output power transistors alternatively turn-off completely during a complete cycle, and distortion is caused by the consequent turn-on delays that occur. Obviously the problem of crossover distortion becomes more marked at high frequency.

In the relevant literature, there are many examples of circuits for controlling the bias (quiescent) current. Two particularly interesting articles are B. Roehr, "A simple direct-coupled power MOSFET audio amplifier topology featuring bias stabilization", by IEEE TRANSACTIONS ON CONSUMER ELECTRONICS 546 (1982), and the article entitled "Une autre conception de l'amplificateur de puissance", published as application note AN80-5 at pages 75–79 of the Siliconix catalog distributed in France.

The Roehr article describes a power amplifier wherein the biasing current of the output power devices is controlled by means of a complex system that detects the quiescent current Iq, and which is based on a limiting circuit, followed by a filter. The stabilization circuit employs, among other devices, an operational amplifier and a large capacitor. Significantly, the capacitor used has a capacitance that is two orders of magnitude higher than the capacitance of the other capacitors employed in the circuit, as shown at page 550.

The amplifier circuit described in the Siliconix application note is similar to that in the Roehr article, but without the circuit for detecting quiescent current Iq. In this circuit, the control of the quiescent current Iq is implemented by a potentiometer, as shown in the circuit diagram at page 78.

The above known solutions for implementing a control of the output stage, and particularly the fact that they require the use of either a large capacitor or a potentiometer, makes them unsuitable to be realized in a fully integrated form.

Moreover, as depicted at page 79 of the Siliconix application note, the driving circuit of the two output power transistors employs PNP bipolar transistors having a relatively high current carrying capacity. Should a monolithic integration of the driving circuit be considered, the presence of PNP transistors will require a relatively large area of integration. It is generally convenient to limit the number of PNP transistors to a minimum.

A step forward in improving these techniques is represented by the output stage disclosed in U.S. Pat. No. 5,216,381 of SGS-Thomson Microelectronics S.R.L. (issued from patent application Ser. No. 07/808,489). In that application a unit gain output stage employing a pair of power FETs, particularly suited for integrated power amplifiers, and which effectively reduces crossover distortion, irrespectively of its origin, is disclosed. Moreover, the circuit does not require the use of practically non-integratable components, such as large capacitors, potentiometers and the like, notwithstanding the fact that the circuit is perfectly capable of effectively controlling the quiescent current through the field effect output power transistors. The pertinent description contained in the above-noted U.S. patent application is herein incorporated by express reference.

In many applications, a limitation of power dissipation within the chip containing the functional circuits of the drive amplifier is required. Often, this is obtained by realizing one or both of the output power transistors, driven in class AB, in discrete form or in any case outside the integrated circuit containing the drive amplifier. A typical example or situation of this type is that of an integrated circuit containing the drive amplifier of a so-called external Voice Coil Motor (VCM), that can be driven in class AB mode.

A general objective of device manufacturers is that of realizing the entire drive circuit in a single chip, mounted in a single package, with characteristics of substantially "universal" utility. In other words, the same IC should advantageously be usable by a manufacturer of apparatuses in a large number of applications that may contemplate different levels of the excitation current delivered to a VCM motor or the like, and therefore different values of power dissipation by simply choosing the value of external components depending upon the specific requisites of the application. The advantages that would be derived are manyfold, both in terms of a reduced cost of the package (which may be a standard low cost type, without heat sink if the output power transistors are external) and of the possibility of producing the integrated circuit for relatively large sale volumes.

On the other hand, when the output power transistors are outside the device containing the integrated drive circuit and the handled power is no longer dissipated within the integrated circuit, the circuit must be capable of driving the two external power devices, while controlling their operating condition under any situation of operation, independent of their intrinsic characteristics. In fact, with the power devices external to the integrated circuit, it is necessary, according to a well known technique, to sense the current actually delivered to the load (commonly done with sensing resistances). The need to employ external sensing resistances of the current is in contrast with a general requirement of reducing to the minimum the number of external components.

Also in the power amplifier circuit described in the cited prior U.S. Pat. No. 5,216,381, advantageously employing a pair of field effect transistors (FETs) as output power elements should be required to realize the two output power transistors outside an integrated driving circuit, external sensing resistances of the current will be necessary in order to implement an effective control of the operating conditions of the two power FETs.

The present application provides an innovative and effective method and device for controlling the operation of a pair of power transistors, at least one of which is externally connected to the integrated circuit containing the driving and controlling circuitry of the two output power transistors, which advantageously does not require any external sensor of the operating condition of an externally connected power transistor or of said pair of external transistors.

An important innovative teaching of the present application is using a buffer stage for driving one of a pair of output power transistors that is connected externally to the integrated circuit and which, in case of a pair of n-channel output power transistors, will be the pull-up or upper transistor, while in the case of a pair of p-channel output transistors, will be the pull-down or lower transistor of the pair. The buffer stage may be functionally connected between the output node of an amplifying stage of the driving signal and a control terminal (gate) of the driven external transistor of the output pair. The invention further employs a limiting network comprising at least a field effect transistor, which may be directly driven by the output node of the signal amplifying stage and a resistance functionally connected in series with the transistor. The so-constituted limiting network is connected between a supply node (VCC) and the output node of the output power stage.

In practice, the limiting network virtually reproduces within the integrated control circuit either a pull-up ("high side") transistor (in the case of an n-channel output transistor pair), or a pull-down ("low side") transistor (in the case of a p-channel output transistor pair), provided with a resistance in series with its drain terminal, while the buffer that drives the "homologous" external power transistor has the function of shifting, respectively toward ground potential or toward the supply voltage, the level of the input signal by a value equal to the threshold voltage of the field effect transistor of the limiting network, under quiescent bias conditions. In this way, under quiescent conditions, the voltage between the gate and the source of the external output power transistor is null thus ensuring the turning-off of the external power transistor, independently of the value of its intrinsic threshold voltage.

When the current absorbed by the load increases, the voltage V(OP1), present on the output node of an operational amplifier OP1 that amplifies the driving signal increases, thus bringing the field effect transistor of the limiting network toward saturation. On the other hand, since the maximum current that flows through the transistor of the limiting network is limited by the resistance in series with its drain, when the current drawn by the load becomes larger than such a maximum current that may be delivered by the transistor of the limiting network, the voltage V(OP1) on the output node of the signal amplifier OP1, will increase further and so the output voltage of a buffer BF1 that drives the external power transistor will also increase, until it reaches a voltage such as to satisfy the following relationship:

$$V(OP1) > Vthexternal + V(output)$$

thus turning-on the external power transistor.

In this way, the burden of delivering the current difference between the current required by the load and the maximum current that can be delivered by the integrated transistor of the limiting network is transferred to the external power transistor.

Unlike the known solutions, the circuit of the invention does not require the use of any external components for detecting the load current and advantageously may employ field effect transistors, for example DMOS transistors, capable of greatly reducing power dissipation as compared with bipolar power transistors of similar current-handling capability.

By virtue of the fact that the operation of the circuit is substantially independent of the threshold voltage of the other power transistor of the output pair (n-channel or p-channel), the fact that also such other transistor of the output pair be realized within the integrated driving circuit or not becomes substantially insignificant.

Therefore, depending on the contemplated application, one only or both the output power transistors may be external to the integrated circuit containing the driving and control circuitry.

BRIEF DESCRIPTION OF THE DRAWING

The disclosed inventions will be described with reference to the accompanying drawings, which show important sample embodiments of the invention and which are incorporated in the specification hereof by reference, wherein.

The different aspects and advantages of the invention will become even more evident through the following description of an important embodiment and by referring to the attached drawings, wherein.

DETAILED DESCRIPTION OF THE PREFERRED EMBODIMENTS

Figure 1:
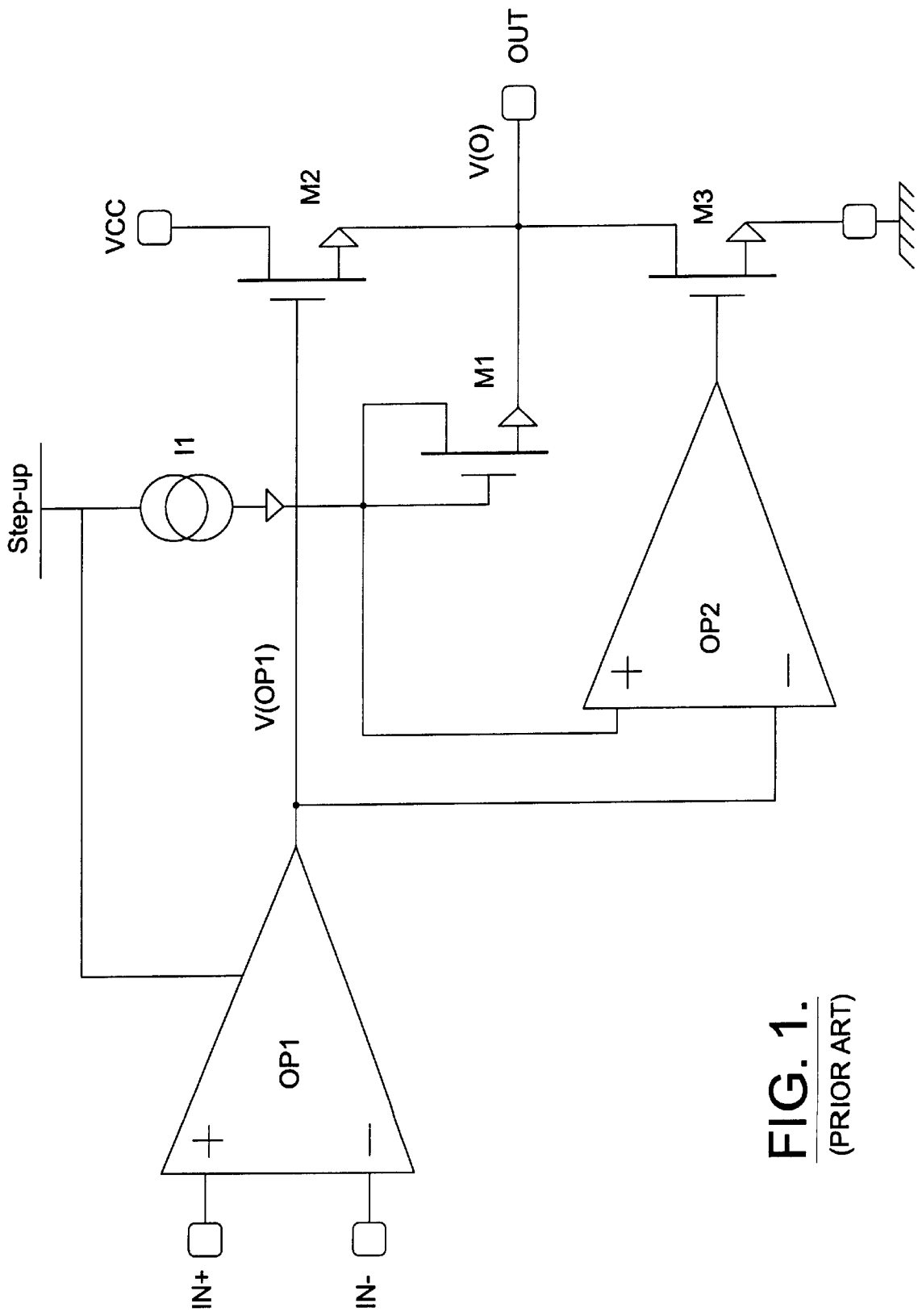
FIG. 1 is a circuit diagram of an integrable unit gain output stage employing a pair of n-channel power transistors, according to the cited U.S. Pat. No. 5,216,381.

The numerous innovative teachings of the present application will be described with particular reference to the presently preferred embodiment (by way of example, and not of limitation), in which:

With reference to FIG. 1, class AB operation requires that a simultaneous ON condition of both the output power transistors M2 and M3, at a controlled current, be ensured during zero-crossing (i.e. when the current flowing through the load at the output node OUT is null). In the case of a pair of n-channel power transistors, this condition can be ensured (as already described in U.S. Pat. No. 5,216,381) by the use of diode-configured transistor M1, current generator I1, and operational amplifier OP2 to jointly perform a control function of the low-side (pull-down) power transistor M3.

The operational amplifier OP1 represents a signal amplifying stage which is responsible of the system's gain. Its output drives the gate of the upper-side (pull-up) power transistor M2, which is connected in a source-follower configuration.

The required overdrive, necessary for ensuring a rail-to-rail output voltage swing may be obtained by powering the output stage of the signal amplifier OP1 with a suitably boosted voltage ("Step-up"), which may be produced e.g. by a DC-DC converter integrated according to well known techniques.

The diode M1 permits to obtain at the drain terminal thereof a voltage, which is compared with the gate voltage of the upper (pull-up) power transistor M2 by the operational amplifier OP2, which controls the gate of the lower power transistor M3.

When the system is in a steady state, in the absence of an input signal, the circuit reaches a situation wherein the voltage difference between the inverting and the non-inverting inputs of OP2 is null. This also implies that the gate-source voltages of M1 and M2 are equal.

By supposing that the area ratio between M2 and M1 is N and that I1 is the current injected in the diode M1 by the current generator, the current that flows through the upper power transistor M2 is given by:

$$I_{M2}=N \cdot I_{M1}=N \cdot I1.$$

Therefore, the quiescent current that flows through the output power stage (M2–M3) is effectively controlled.

In practice, the circuit that includes M1 and OP2 behaves as a transresistance amplifier, driven by the difference between the current I and 1/Nth of the current that flows through the upper power transistor M2.

When the output current (conventionally intended positive when out-flowing and negative when flowing-in) becomes larger than the quiescent current, the system turns-off the lower power transistor M3. Vice-versa, when the output current is negative (flowing-in), the systems reacts by turning-on the lower power transistor M3, enough to carry the output current plus the quiescent current that continues to flow through the upper power transistor M2.

Figure 2:
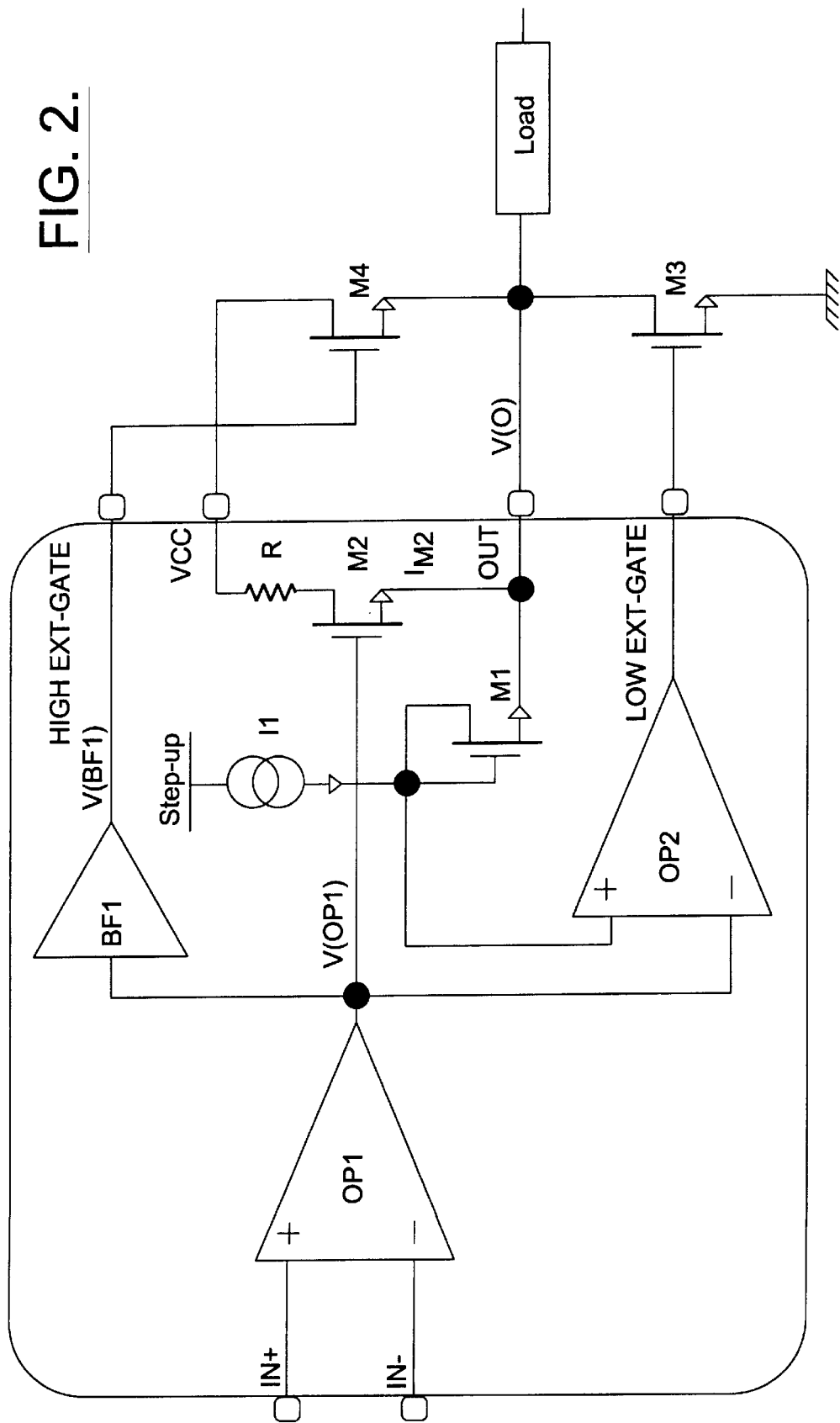
FIG. 2 is a circuit diagram of an innovative output stage, wherein the two n-channel power transistors are connected externally to an integrated circuit which contains a modified driving circuit according to the present invention.

With reference to FIG. 2, which depicts a control circuit modified in accordance with the invention, if at least one of the output power transistors (either both output transistors M4 and M3 as shown or one only of the two power transistors, for example the pull-up transistor M4 in the case shown of an n-channel pair) is connected externally of the integrated circuit, the driving circuit is modified by introducing a buffer stage BF1 for driving the external pull-up power transistor M4 and a limiting network composed of at least a field effect transistor M2 and a resistance connected in series with its drain terminal. This limiting line is connected between the supply rail VCC and the output node OUT of the power stage. The transistor M2 may be directly driven by the output of the signal amplifying stage OP1, as shown.

The buffer stage BF1 shifts toward ground potential its input voltage by a value equal to the threshold voltage of M2 under quiescent conditions. Therefore, under quiescent conditions, the gate-source voltage of the external power transistor M4, driven by the buffer, is null thus ensuring its turning-off (VGSM4=VGSM2−V(BF1)).

Upon an increase of the current drawn by the load (Load), the output voltage V(OP1) of the signal amplifier OP1 increases, pushing toward saturation the transistor M2. Because the maximum current flowing through M2 is limited by the resistance R, when the current required by the load becomes larger than such a limit value IM2, the output voltage of the signal amplifier OP1, will increase further until it satisfies the condition:

V(BF1)>VthM4+V(0)

thus turning-on the external power transistor M4.

To very briefly summarize the operation of this circuit, it may be seen that the current-limited small transistor M2 provides a current contribution which helps to bridge the zero-crossing, so that transistor M4 can be kept off until needed (without causing distortion due to delayed turn-on).

Some specific component values used in the presently preferred embodiment will now be specified to exemplify the inventive concepts. (However, it must be understood that these specific values and ratios are not necessary for using the innovative concepts, and do not limit the scope of the claims.) Resistor R, in a sample embodiment, has a value of about 100 Ohms. In a sample implementation of FIG. 1, M2 and M3 have the same size, and the ratio M2/M1 is about 30. In a sample implementation of FIG. 2, M3 and M4 have the same size, and M2/M1 is about 30. M3 and M4 are discrete components such that, in the presently preferred embodiment, (RdsonM2)/(RdsonM4) is about 100.

Figure 3:
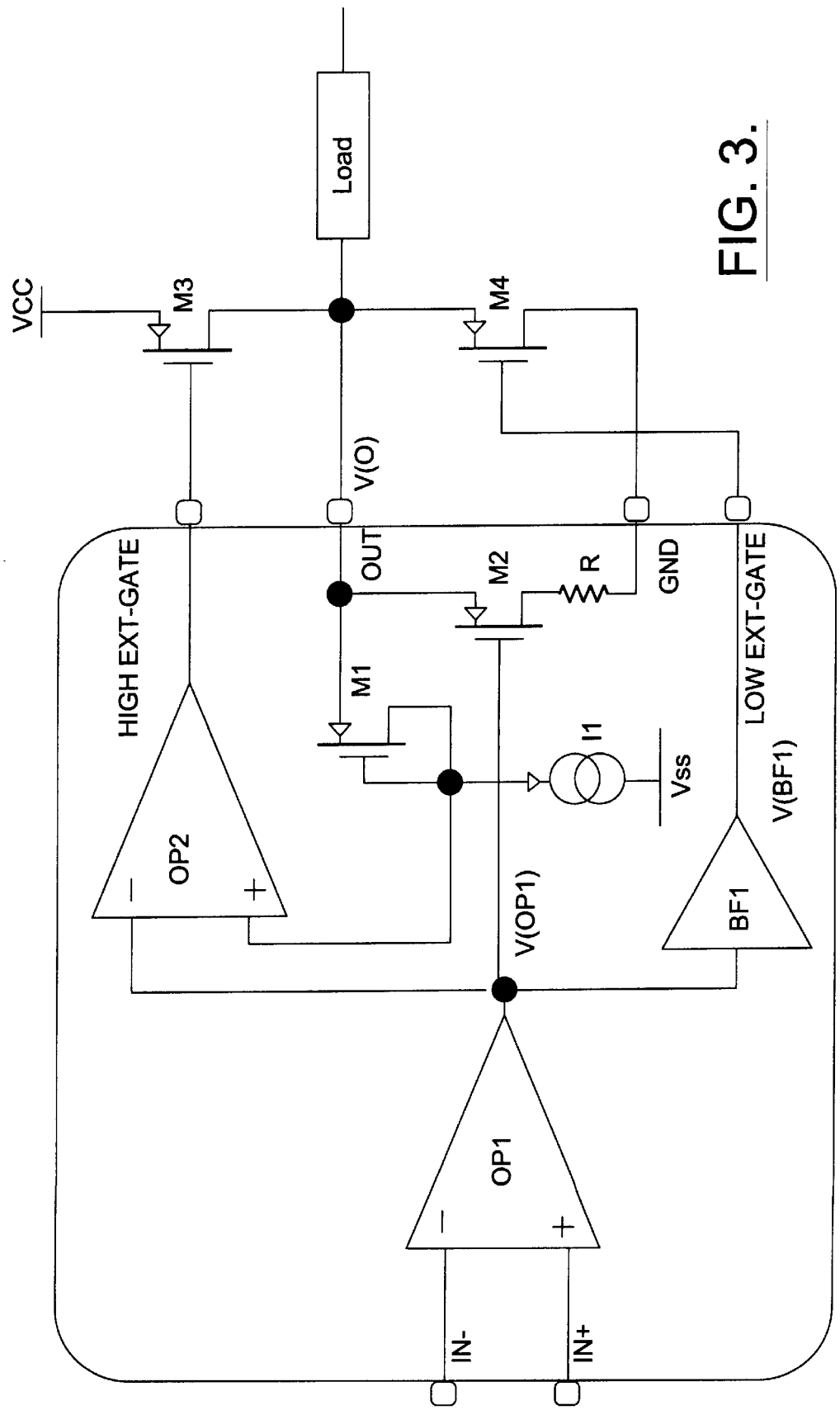
FIG. 3 is a circuit diagram of an output stage according to the present invention, similar to the stage of FIG. 2, but realized with p-channel transistors.

Of course, the circuit arrangement of the invention is applicable also in the case of a circuit that employs a pair of p-channel field effect output transistors, by inverting the sign of the voltages and the sense of the currents. In this case, as will be evident to a skilled person, it will be the pull-down or lower transistor M4 of the output pair, to have its gate driven by a level shifting buffer BF1 and therefore connected, through the same buffer BF1, to the gate of the integrated transistor M2 of the limiting network. Such an alternative embodiment is depicted in FIG. 3.

In audio amplifiers, but not only in these types of amplifiers, it is often advantageous to drive a load through a pair of power amplifiers in a so-called bridge configuration. Also in this case, when for considerations of opportunity, one or both power transistors of the output stage of each of the two, bridge-configured, amplifiers must be external to the integrated circuit containing the respective amplifying and driving circuitry, the circuit arrangement of the invention will permit to control the operation of the externally connected power transistors without requiring external sensing elements.

Figure 4:
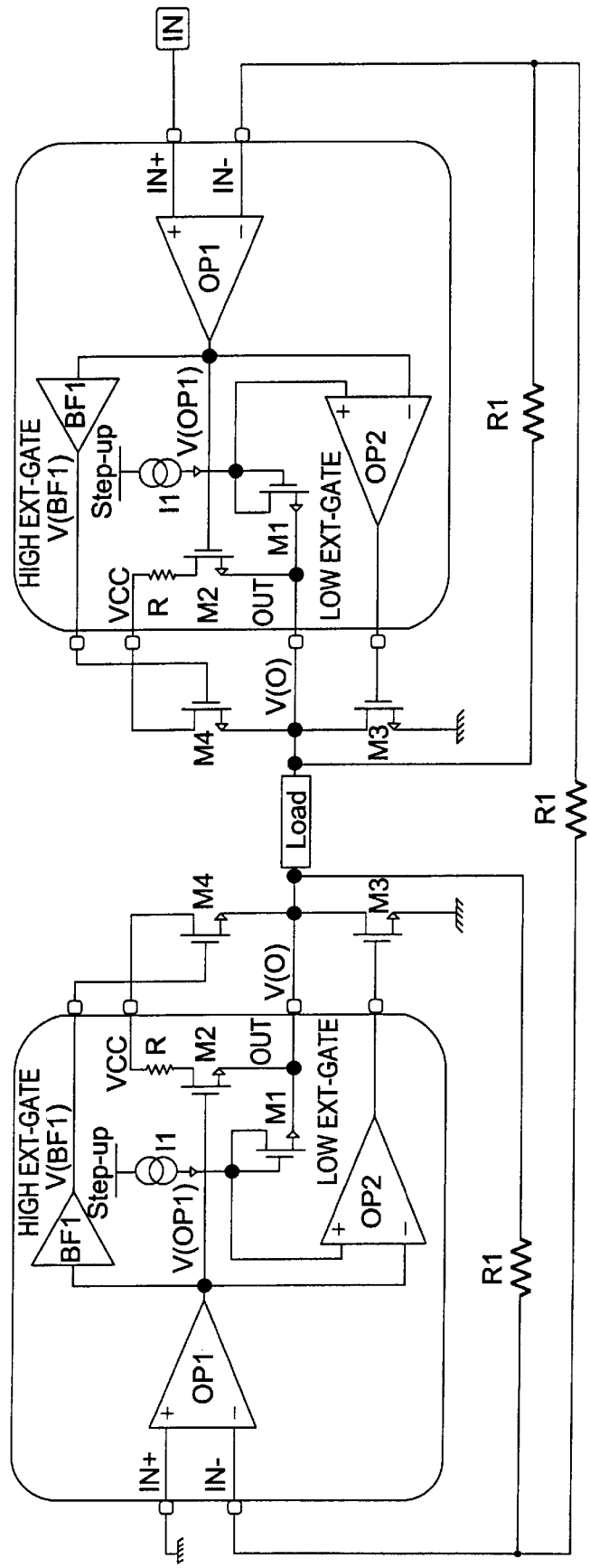
FIG. 4 is a circuit diagram of a bridge amplifier employing two output stages made according to the present invention.

A basic diagram of a bridge-configured amplifier (that is of a pair of power amplifiers) wherein the output stages are realized with external power transistors (M4, M3), controlled by integrated driving circuits, modified according to the present invention, is shown in FIG. 4.

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

For another example, the circuit is designed to work with unipolar power supply, but it can work well even with bipolar power supply with no changes.

What is claimed is:

1. An integrated circuit for driving at least one pair of discrete power field-effect transistors of a first majority-carrier conductivity type, said pair including a first transistor which has a source thereof connected to a first power supply voltage and a drain thereof connected to an output terminal, and said pair also including a second transistor which has a drain thereof connected to a second power supply voltage and a source thereof connected to said output terminal; said integrated circuit comprising:

a connection for receiving an amplified analog input signal;

a buffer connected to drive the gate of said second transistor and functionally connected to said amplified input signal;

a diode-connected transistor of said first majority-carrier conductivity type, having a source terminal thereof connected to said output terminal, and having a drain terminal which is connected to be biased into conduction;

a differential amplifier which is connected to receive, as differential inputs thereto, said amplified input voltage and the voltage of said drain of said diode-connected transistor, and which provides an output for driving the gate of said first transistor; and a limiting network comprising a field effect transistor which has a source terminal connected to said output terminal, and a drain terminal connected through a resistor to said second power supply voltage;

wherein said limiting network provides a current contribution to avoid zero-crossing distortion to an output signal of the integrated circuit.

2. A circuit as defined in claim 1, wherein said pair of power transistors comprises n-channel DMOS transistors.

3. A circuit as defined in claim 1, wherein said pair of power transistors comprises p-channel DMOS transistors.

4. A method for controlling the operation of a pair of power transistors, said pair including a first transistor which has a source thereof connected to an output terminal and a drain connected to a power supply voltage, said method comprising:

using a buffer stage to drive said first transistor, said buffer stage being functionally connected between the output node of an amplifying stage of a driving signal and the gate of said first transistor;

using a limiting network comprising a field effect transistor to reproduce within the integrated control circuit said first transistor, said field effect transistor and a resistance being connected in series between said power supply and the output node;

wherein said field effect transistor has a source terminal connected to said output terminal and a drain terminal connected through a resistor to said power supply voltage; and wherein said buffer has the function of shifting the level of an analog input signal by a value equal to the threshold voltage of the field effect transistor of the limiting network, under quiescent bias conditions;

wherein said limiting network provides a current contribution to avoid zero-crossing distortion to an output signal of the integrated circuit.

5. The method of claim 4, wherein said pair of power transistors comprises n-channel DMOS transistors.

6. The method of claim 4, wherein said pair of power transistors comprises p-channel DMOS transistors.

7. A driving circuit for a class AB output stage comprising a pair of power transistors, at least one of said power transistors being external to a chip which includes said driving circuit, said driving circuit comprising:

a differential amplifier for comparing the output voltage of a signal amplifying stage with a voltage present on the anode of a diode having a cathode connected to an output node of the output stage and directly biased by a current generator which supplies a quiescent current to the diode and the transistor of said pair that is controlled by the output of said differential amplifier;

a buffer stage for driving said external power transistor, functionally connected between an output node of said signal amplifying stage and a control terminal of said external power transistor;

a limiting network comprising at least a field effect transistor, which is driven by the output of said signal amplifying stage, and a resistance connected in series between a power supply node and said output node of the output stage;

wherein said limiting network provides a current contribution to avoid zero-crossing distortion to an output signal of the integrated circuit.

8. A circuit as defined in claim 7, wherein said pair of power transistors comprises n-channel DMOS transistors.

9. A circuit as defined in claim 7, wherein said pair of power transistors comprises p-channel DMOS transistors.

10. A circuit as defined in claim 8, wherein said external power transistor driven by said buffer stage is the pull-up or upper transistor of said pair.

11. A circuit according to claim 10, wherein the pull-down or lower transistor of said pair is also external to said integrated driving circuit.

12. A circuit as defined in claim 9, wherein said external power transistor driven by said buffer stage is the pull-down or lower transistor of said pair.

13. A circuit according to claim 12, wherein also the pull-up or upper transistor of said pair is external to said integrated driving circuit.

14. A bridge amplifier comprising:

two output stages each of which is composed of a pair of power transistors, said pair including a first transistor which has a source thereof connected to a first power supply voltage and a drain thereof connected to an output terminal, and said pair also including a second transistor which has a drain thereof connected to a second power supply voltage and a source thereof connected to said output terminal, at least one of said power transistors being external to a chip containing a respective integrated driving circuit, said integrated driving circuits each comprising:

a connection for receiving an amplified analog input signal;

a buffer connected to drive the gate of said second transistor and functionally connected to said amplified input signal;

a diode-connected transistor of said first majority-carrier conductivity type, having a source terminal thereof connected to said output terminal, and having a drain terminal which is connected to be biased into conduction;

a differential amplifier which is connected to receive, as differential inputs thereto, said amplified input voltage and the voltage of said drain of said diode-connected transistor, and which provides an output for driving the gate of said first transistor; and a limiting network comprising a field effect transistor which has a source terminal connected to said output terminal, and a drain terminal connected through a resistor to said second power supply voltage;

wherein said limiting network provides a current contribution to avoid zero-crossing distortion to an output signal of the integrated circuit.

15. An integrated circuit, for driving at least one pair of discrete power field-effect transistors of a first majority-carrier conductivity type, said pair including a first transistor which has a source thereof connected to a first power supply voltage and a drain thereof connected to an output terminal, and said pair also including a second transistor which has a drain thereof connected to a second power supply voltage and a source thereof connected to said output terminal; said integrated circuit comprising:

a connection for receiving an amplified analog input signal which is functionally connected to the gate of said second power transistor;

a diode-connected transistor of said first majority-carrier conductivity type, having a source terminal thereof connected to said output terminal, and having a drain terminal which is connected to be biased into conduction;

a differential amplifier which is connected to receive, as differential inputs thereto, said amplified input voltage and the voltage of said drain of said diode-connected transistor, and which provides an output for driving the gate of said first transistor; and a limiting network comprising a field effect transistor which has a source terminal connected to said output terminal, and a drain terminal connected through a resistor to said second power supply voltage;

wherein said limiting network provides a current contribution to avoid zero-crossing distortion to an output signal of the integrated circuit.

16. The integrated circuit of claim 15, wherein said pair of power transistors comprises n-channel DMOS transistors.

17. The integrated circuit of claim 15, wherein said pair of power transistors comprises n-channel DMOS transistors.

18. The integrated circuit of claim 15, wherein at least one of said pair of power transistors is external to said integrated circuit.

19. A circuit as defined in claim 15, wherein said external power transistor is the said first transistor.

20. A circuit according to claim 19, wherein the said second transistor of said pair is also external to said integrated circuit.

21. A circuit as defined in claim 15, wherein said external power transistor is said second transistor.

22. A circuit according to claim 21, wherein the said first transistor of said pair is also external to said integrated circuit.

* * * * *